(12) United States Patent
Rogovin et al.

(10) Patent No.: US 7,970,559 B2
(45) Date of Patent: Jun. 28, 2011

(54) IDENTIFYING DAMAGE TO A WIRE

(75) Inventors: Daniel N. Rogovin, Newbury Park, CA (US); Martin W. Kendig, Thousand Oaks, CA (US)

(73) Assignee: The Boeing Company, Chicago, IL (US)

( * ) Notice: Subject to any disclaimer, the term of this patent is extended or adjusted under 35 U.S.C. 154(b) by 105 days.

(21) Appl. No.: 12/210,178

(22) Filed: Sep. 12, 2008

(65) Prior Publication Data

US 2010/0066384 A1     Mar. 18, 2010

Related U.S. Application Data

(63) Continuation of application No. 10/901,577, filed on Jul. 29, 2004, now abandoned.

(51) Int. Cl.
*G01R 31/00* (2006.01)
*G01R 31/08* (2006.01)
*G01R 31/02* (2006.01)

(52) U.S. Cl. ......... 702/58; 324/541; 324/525; 379/1.01; 379/30

(58) Field of Classification Search ............ 702/58, 702/59; 324/541, 525; 379/30
See application file for complete search history.

(56) References Cited

U.S. PATENT DOCUMENTS

| 5,502,392 | A | * | 3/1996 | Arjavalingam et al. | ...... 324/638 |
| 2004/0046570 | A1 | * | 3/2004 | Teich | ...... 324/541 |

* cited by examiner

*Primary Examiner* — Mohamed Charioui
*Assistant Examiner* — Janet L Suglo

(57) ABSTRACT

Methods, systems, and articles of manufacture consistent with the present invention determine the type of damage to a wire, the amount of damage, and the location of the damage based on the wire's broadband impedance measured from a single measurement point. The type of damage is determined by comparing the wire's calculated dielectric function, resistance and inductance to known values that correspond to types of wire damage. The amount of damage is determined by comparing the wire's low-frequency impedance phase to known low-frequency impedance phase information that corresponds to a known amount of wire damage. The location of damage is determined by comparing the wire's high-frequency impedance phase to known high-frequency impedance phase information that corresponds to a known location of wire damage.

14 Claims, 12 Drawing Sheets

MEASURED IMPEDANCE MAGNITUDE SPECTRUM
OPEN-CIRCUIT CONFIGURATION

MEASURED IMPEDANCE PHASE SPECTRUM
OPEN-CIRCUIT CONFIGURATION

MEASURED IMPEDANCE MAGNITUDE SPECTRUM
CLOSED-CIRCUIT CONFIGURATION

MEASURED IMPEDANCE PHASE SPECTRUM
CLOSED-CIRCUIT CONFIGURATION

REAL COMPONENT OF DIELECTRIC FUNCTION

IMAGINARY COMPONENT OF DIELECTRIC FUNCTION

AMOUNT OF WIRE DAMAGE

IDENTIFYING DAMAGE TO A WIRE

GOVERNMENT CONTRACT

This invention was made with Government support under Contract No. DTFA-03-C-00014 awarded by the FAA. The Government has certain rights in this invention.

BACKGROUND OF THE INVENTION

The present invention generally relates to the field of electrical wire testing and, more particularly, to methods and systems for determining the type of damage, the amount of damage, and the location of damage to a wire using broadband impedance.

Damaged wiring can lead to detrimental conditions, such as short circuits. When the damaged wiring is located in, for example, commercial or military aircraft, space vehicles, or nuclear power plants, the damaged wiring can lead to serious problems.

Conventional approaches for determining whether a wire is damaged include hi-pot and wire insulation tests. Although these conventional methods are effective to detect damage in a wire, such as short circuits using the hi-pot test or damaged insulation using the wire insulation test, the conventional tests can break or damage the wire. For example, during a hi-pot test, a high voltage of 500V is typically applied to the wire. Such voltage can damage a delicate wire or thin conductor. Further, conventional approaches determine whether a wire is damaged, but fail to provide the type of damage, the location of the damage, or the amount of damage.

SUMMARY OF THE INVENTION

Methods, systems, and articles of manufacture consistent with the present invention determine the type of damage, the amount of damage, and/or the location of damage to a wire using broadband impedance measured from a single measurement point on the wire.

In accordance with methods consistent with the present invention, a method in a data processing system having a program for identifying damage to a wire is provided. The method comprises the steps of obtaining a broadband impedance information for the wire from a single measurement point, and determining a type of damage to the wire based on the broadband impedance information.

In accordance with articles of manufacture consistent with the present invention, a computer-readable medium containing instructions that cause a data processing system having a program to perform a method for identifying damage to a wire is provided. The method comprises the steps of obtaining a broadband impedance information for the wire from a single measurement point, and determining a type of damage to the wire based on the broadband impedance information.

In accordance with systems consistent with the present invention, a data processing system for identifying damage to a wire is provided. The data processing system comprises: a memory having a program that obtains a broadband impedance information for the wire from a single measurement point, and determines a type of damage to the wire based on the broadband impedance information; and a processing unit that runs the program.

In accordance with systems consistent with the present invention, a wire analyzer for identifying damage to a wire is provided. The wire analyzer comprises means for obtaining a broadband impedance information for the wire from a single measurement point, and means for determining a type of damage to the wire based on the broadband impedance information.

Other features of the invention will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The accompanying drawings, which are incorporated in an constitute a part of this specification, illustrate an implementation of the invention and, together with the description, serve to explain the advantages and principles of the invention. In the drawings.

Corresponding reference characters indicate corresponding parts throughout the several views of the drawings.

DETAILED DESCRIPTION OF THE INVENTION

Reference will now be made in detail to an implementation in accordance with methods, systems, and articles of manufacture consistent with the present invention as illustrated in the accompanying drawings.

Methods, systems, and articles of manufacture consistent with the present invention determine the type of damage, the amount of damage, and/or the location of damage to a wire using broadband impedance measured from a single measurement point on the wire.

Figure 1:
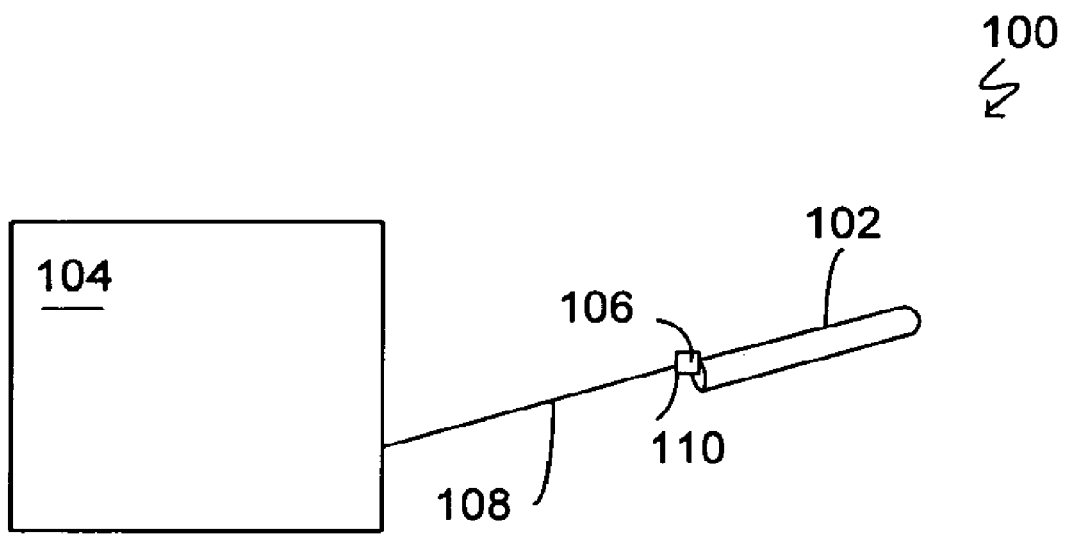
FIG. 1 is a schematic diagram of a system for analyzing a wire for damage consistent with the present invention.

FIG. 1 depicts a block diagram of a system 100 for detecting and locating wire damage in a wire consistent with the present invention. As illustrated, the system 100 generally comprises a wire 102, which may be damaged, for example, by a short-circuit or degraded insulation. A data analysis system 104 is connected to a measurement point 106 of wire 102 via a cable 108. Cable 108 electrically connects to wire 102 via one or more connectors 110, such as a banana clip or other type of connector. Data analysis system 104 measures the broadband impedance of wire 102, determines whether there is damage along the wire, determines the amount of damage, and locates the damage based on the measured broadband impedance. Further, data analysis system 104 determines the location of the damage at any point along the wire using the measured broadband impedance obtained from the single measurement point 106.

Figure 2:
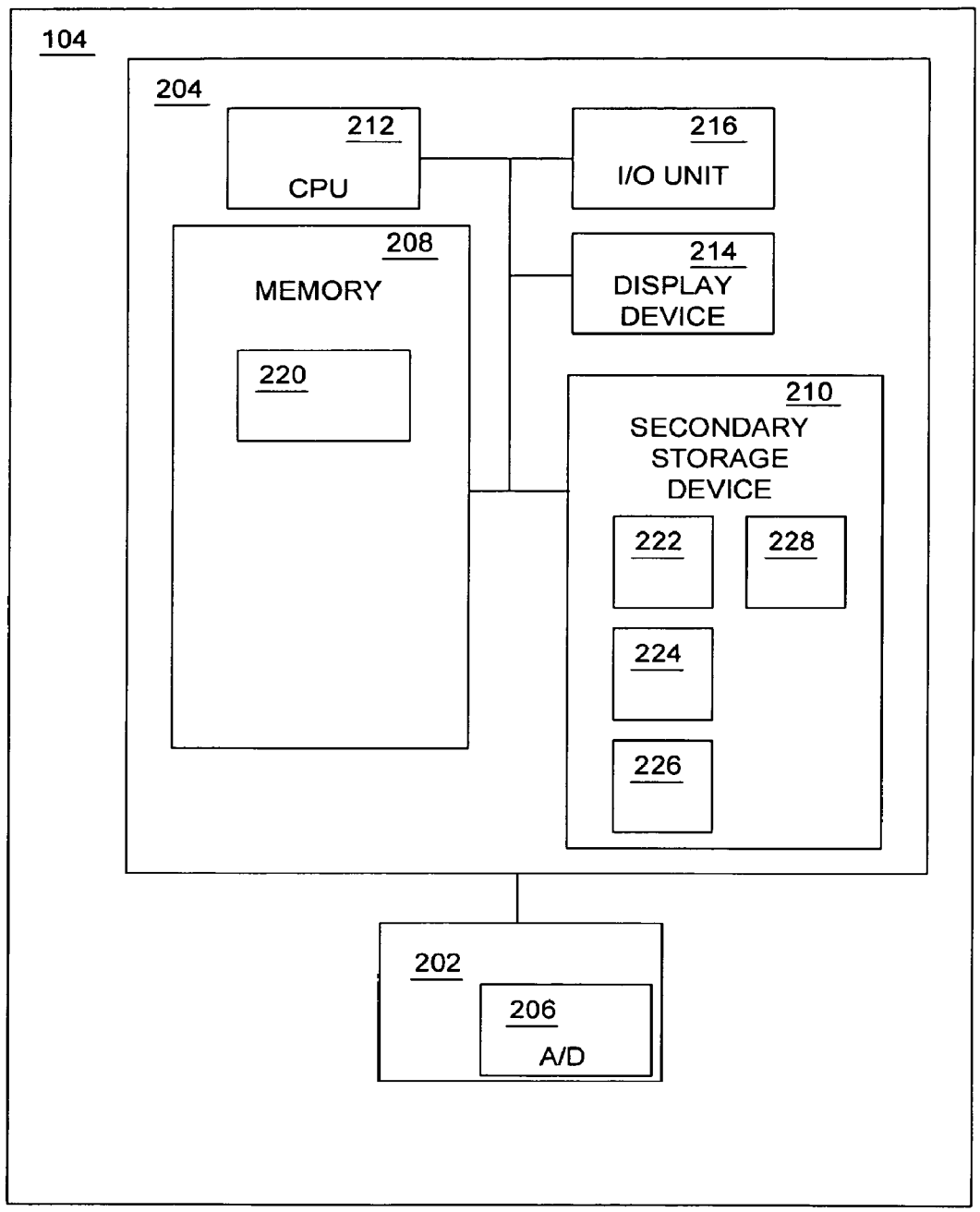
FIG. 2 is a block diagram of a data analysis system consistent with the present invention.

FIG. 2 depicts data analysis system 104 in more detail. Data analysis system 104 comprises an impedance measurement device 202 and a data processing system 204. Impedance measurement device 202 measures the magnitude and phase of the broadband impedance of wire 102, and can be a suitable off-the-shelf impedance measurement device. For example, the impedance measurement device can be, but is not limited to, the 4294A Precision Impedance Analyzer manufactured by Agilent Technologies, Inc. of Palo Alto, Calif., U.S.A. As impedance measurement devices are known to those skilled in the art, the impedance measurement device will not be described in further detail.

During operation, the impedance measurement device outputs a low-voltage output signal, which is transmitted through wire 102 via cable 108. The frequency of the output signal is adjusted so impedance measurement device 202 measures the frequency-dependant impedance of wire 102 across a range of frequencies, such as from about 0 Hz to about 100 MHz. The measured impedance information is converted to a digital signal by an analog-to-digital converter 206 and output from the impedance measurement device. Once the signal is in a digital form, it can be processed by data processing system 204. Collected impedance information may be archived in a memory 208 or a secondary storage 210 of data processing system 204.

One having skill in the art will appreciate that the data acquisition and data collection functionality of data analysis system 102 can be included in a device separate from data processing system 204. The separate device would comprise an impedance measurement system having an analog-to-digital converter, a processing unit, and a memory. The collected data would be stored on the separate device during data acquisition and transferred to the data processing system 204 for processing.

Data processing system 204 comprises a central processing unit (CPU) or processor 212, a display device 214, an input/output (I/O) unit 216, secondary storage device 210, and memory 208. The data processing system may further comprise standard input devices such as a keyboard, a mouse or a speech processor (each not illustrated).

Memory 208 comprises a program 220 for identifying the type, amount, and location of damage to a wire, such as wire 102. In an illustrative example, program 220 is implemented using MATLAB® software, however, the program can be implemented using another application program or another programming language. As will be described in more detail below, the program determines the type of damage to a wire by analyzing the wire's dielectric function, resistance and inductance, analyzes the low-frequency portion of the phase of the wire's broadband impedance information to determine the amount of the wire damage, and analyzes the high-frequency portion of the phase of the wire's broadband impedance information to locate the damage. MATLAB is a United States registered trademark of The MathWorks, Inc. of Natick, Mass.

One having skill in the art will appreciate that the program can reside in memory on a system other than data processing system 204. Program 220 may comprise or may be included in one or more code sections containing instructions for performing their respective operations. Although program 220 is described as being implemented as software, the program may be implemented as a combination of hardware and software or hardware alone. Also, one having skill in the art will appreciate that program 220 may comprise or may be included in a data processing device, which may be a client or a server, communicating with data processing system 204. Further, data analysis system 104 can itself be an impedance measurement device.

Although aspects of methods, systems, and articles of manufacture consistent with the present invention are depicted as being stored in memory, one having skill in the art will appreciate that these aspects may be stored on or read from other computer-readable media, such as secondary storage devices, like hard disks, floppy disks, and CD-ROM; a carrier wave received from a network such as the Internet; or other forms of ROM or RAM either currently known or later developed. Further, although specific components of data processing system 204 have been described, one having skill in the art will appreciate that a data processing system suitable for use with methods, systems, and articles of manufacture consistent with the present invention may contain additional or different components.

Data processing system 204 can itself also be implemented as a client-server data processing system. In that case, program 220 can be stored on the data processing system as a client, and some or all of the steps of the processing described below can be carried out on a remote server, which is accessed by the client over a network. The remote server can comprise components similar to those described above with respect to the data processing system, such as a CPU, an I/O, a memory, a secondary storage, and a display device.

Figure 3:
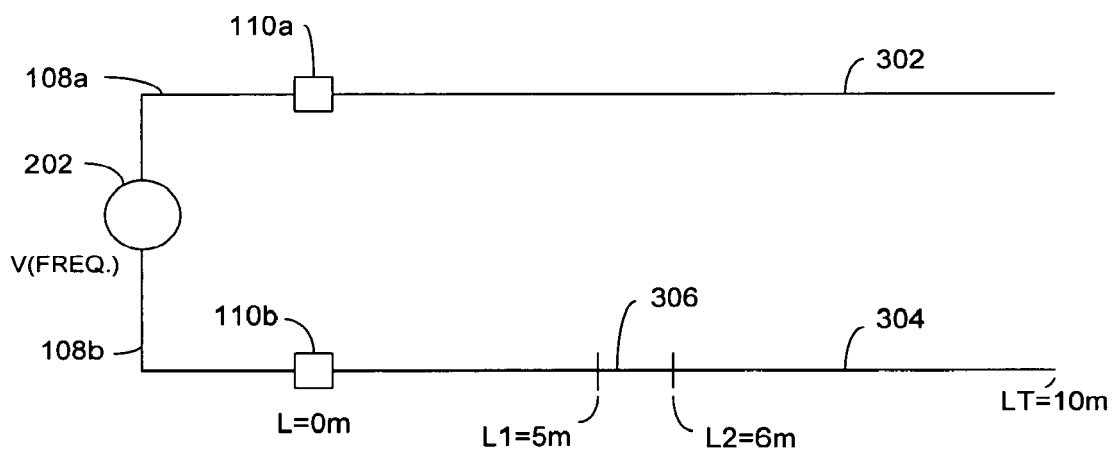
FIG. 3 is a detail of the wire in FIG. 1.

FIG. 3 depicts the illustrative wire 102 in more detail. As shown, the illustrative wire comprises two conductors 302 and 304, which are illustratively arranged in a twisted-pair configuration. Alternatively, conductors 302 and 304 can be arranged in a different configuration, such as a coaxial or parallel-spaced conductor configuration. Conductors 302 and 304 are preferably insulated. The wire has a length ($L_T$), which is 10 meters in the illustrative example. Wire damage 306 is present along the wire from location $L_1$ to location $L_2$ and represents, for example, a short circuit, damaged insulation, or another type of defect. In the illustrative example, the wire damage is damaged insulation in conductor 304 from $L_1$=5 meters to $L_2$=6 meters. The damage represents damage, for example, from humidity or exposure to hydraulic fluid.

Impedance measurement device 202 transmits the low-voltage signal to wire 102 via conductors 108a and 108b of cable 108. As shown, conductors 108a and 108b of cable 108 connect to the conductors of wire 102 via respective connectors 110a and 110b. The low-voltage signal from the impedance measurement device has a potential of, for example, a few volts. Thus, there is a lower risk of damaging the wire with low-voltage signal consistent with the present invention than with conventional test signals that typically have a potential of around 500 volts.

Figure 4:
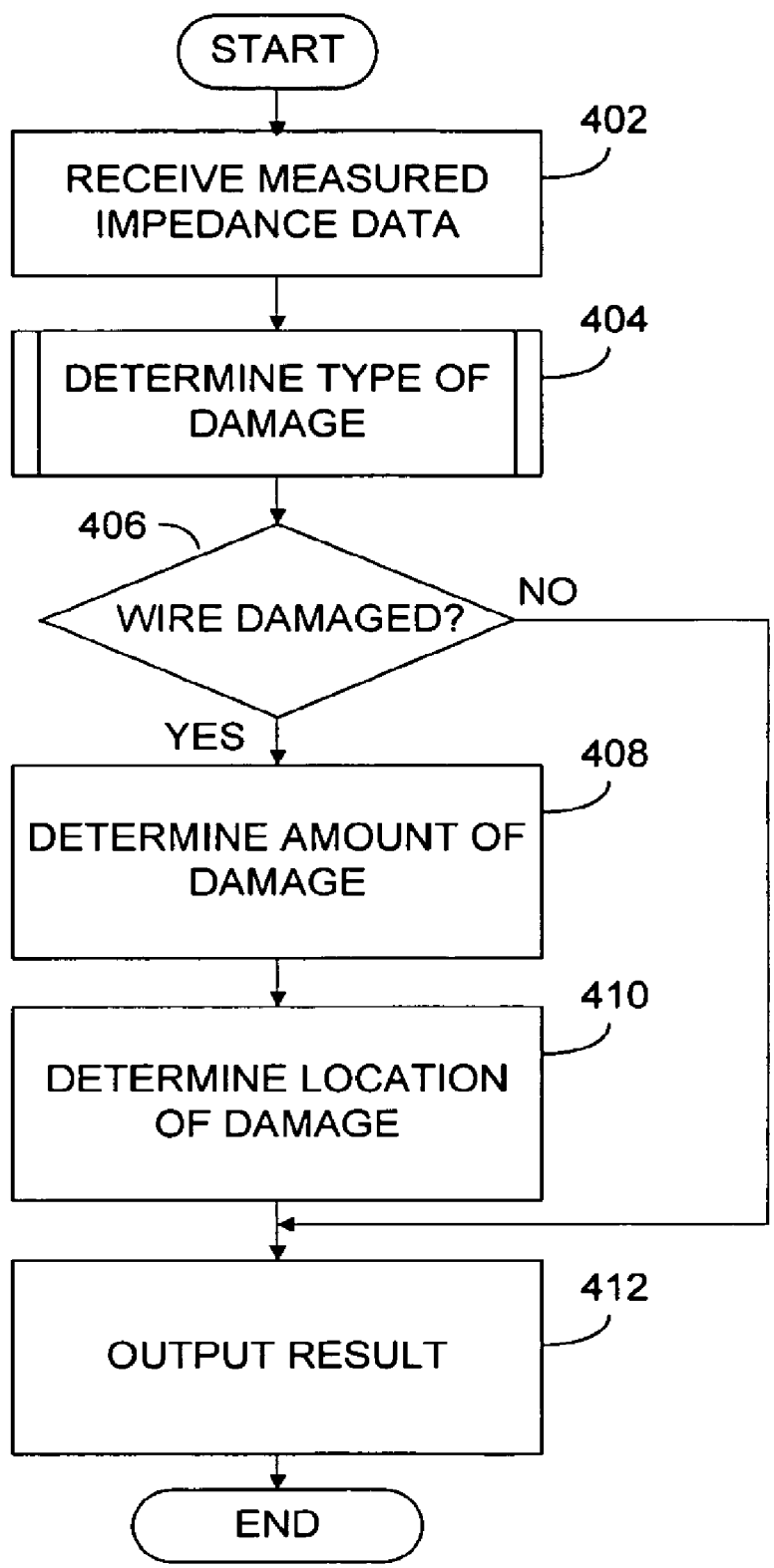
FIG. 4 is a flow diagram of the exemplary steps for determining a type of wire damage, the amount of damage, and the location of the damage consistent with the present invention.

FIG. 4 depicts a flow diagram illustrating the exemplary steps performed by program 220 for detecting and identifying the type, amount, and location of damage to a wire, such as wire damage 306, on a wire. As will be described in more detail below, the program determines the type of damage to a wire by analyzing the wire's dielectric function, resistance and inductance, analyzes the low-frequency portion of the phase of the wire's measured broadband impedance information to determine the amount of wire damage, and analyzes the high-frequency portion of the phase of the wire's measured broadband impedance information to locate the damage. First, the program receives the measured impedance information for the wire (step 402). The measured impedance information can be received, for example, as a data file in the memory or in the secondary storage. Alternatively, the program can measure the measured impedance over a predetermined range of frequencies and store the frequency-dependent impedance magnitude and phase spectra, for example, in the memory or the secondary storage. In the illustrative example, the impedance measurement device measures the frequency-dependent impedance magnitude and phase spectra and transfers the information to the data processing system, where the information is saved in a measured-data data file 222 in the secondary storage. The broadband impedance data is measured for cases in which the wire is in an open-circuit configuration and a closed-circuit configuration at the end of the wire opposite the measurement point.

Figure 5:
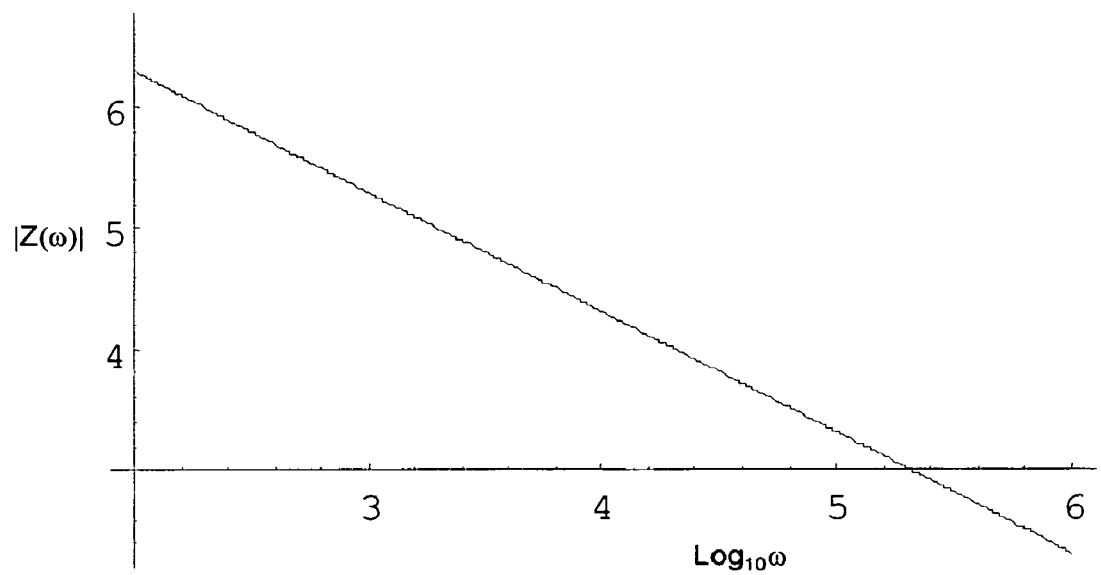
FIG. 5 is a measured frequency-dependent magnitude spectrum of the wire of FIG. 1 for a case in which the wire is in an open-circuit configuration.
Figure 6:
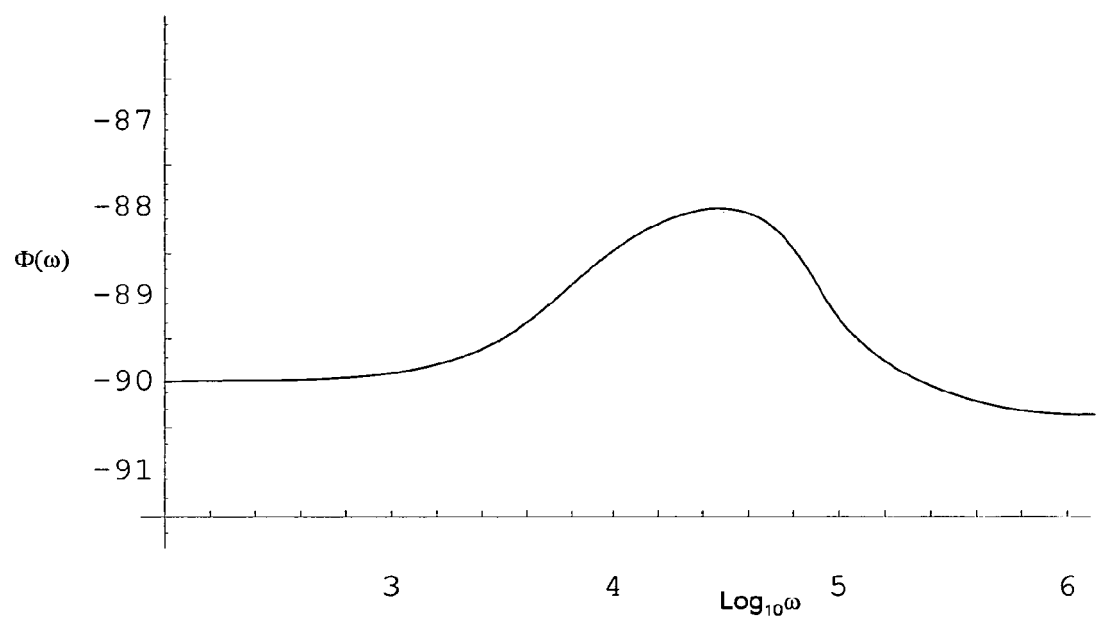
FIG. 6 is a measured frequency-dependent phase spectrum of the wire of FIG. 1 for a case in which the wire is in an open-circuit configuration.

The data for the measured impedance magnitude spectrum for the illustrative example, wherein the wire is in an open-circuit configuration, is shown in FIG. 5. The phase spectrum for the measured impedance data, wherein the wire is in an open-circuit configuration, is depicted in FIG. 6.

Figure 7:
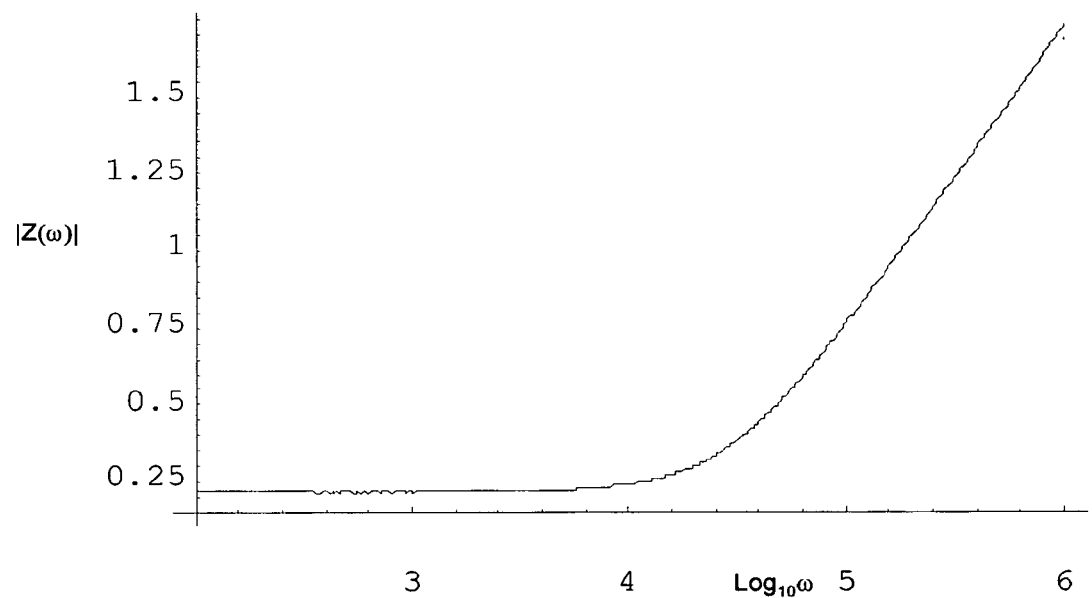
FIG. 7 is a measured frequency-dependent magnitude spectrum of the wire of FIG. 1 for a case in which the wire is in a closed-circuit configuration.
Figure 8:
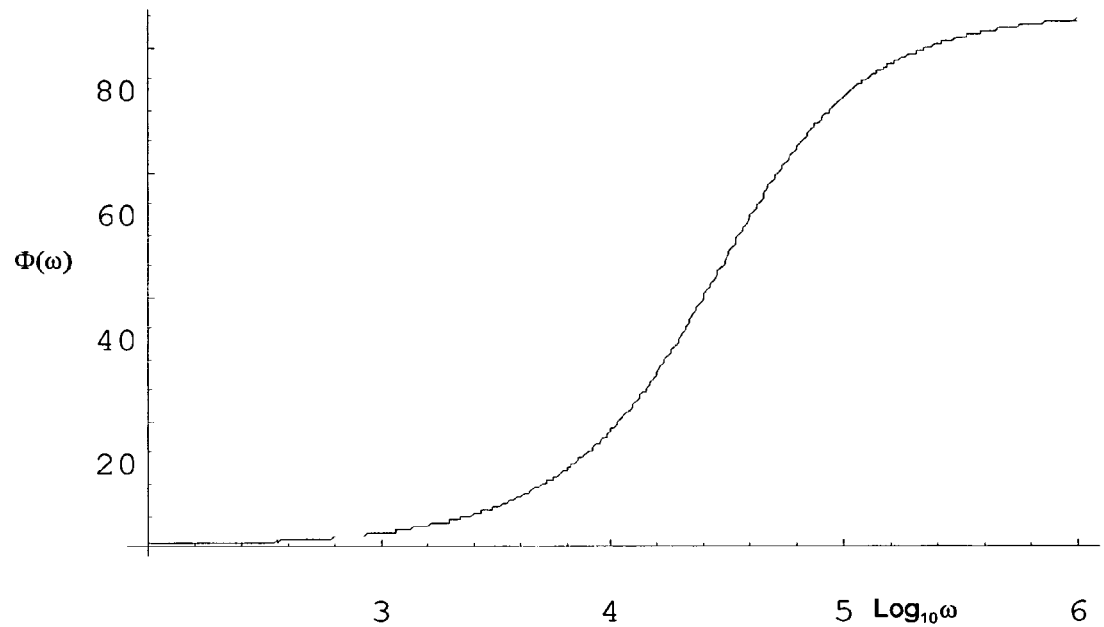
FIG. 8 is a measured frequency-dependent phase spectrum of the wire of FIG. 1 for a case in which the wire is in a closed-circuit configuration.

Further, the data for the measured impedance magnitude spectrum for the illustrative example, wherein the wire is in a short-circuit configuration, is shown in FIG. 7. The phase spectrum for the measured impedance data, wherein the wire is in a short-circuit configuration, is depicted in FIG. 8.

Then, the program determines whether the wire is damaged by a known type of damage (step 404). To determine whether the wire is damaged, the program calculates the wires frequency-dependent dielectric function ($\in(\omega)$), resistance ($R(\omega)$), and inductance ($L(\omega)$) based on the measured broadband impedance of the wire and compares these calculated values to known values corresponding to various types of damage. Through extensive experimentation, the inventors have discovered the frequency-dependent dielectric function, resistance, and inductance contribute to the electrical properties of the wire and correspond to the state of the insulation and conductor. For example, the skin effect, which results from an oxide layer or other type of layer contacting the surface of the conductor, manifests itself in the conductor's resistance. Also, when the wire's insulation is affected by various environmental stresses, the wire's dielectric function exhibits two microscopic processes: a relatively slow ionic process that is nearly Debye and a relatively fast electronic process that is nearly independent of frequency.

Figure 9:
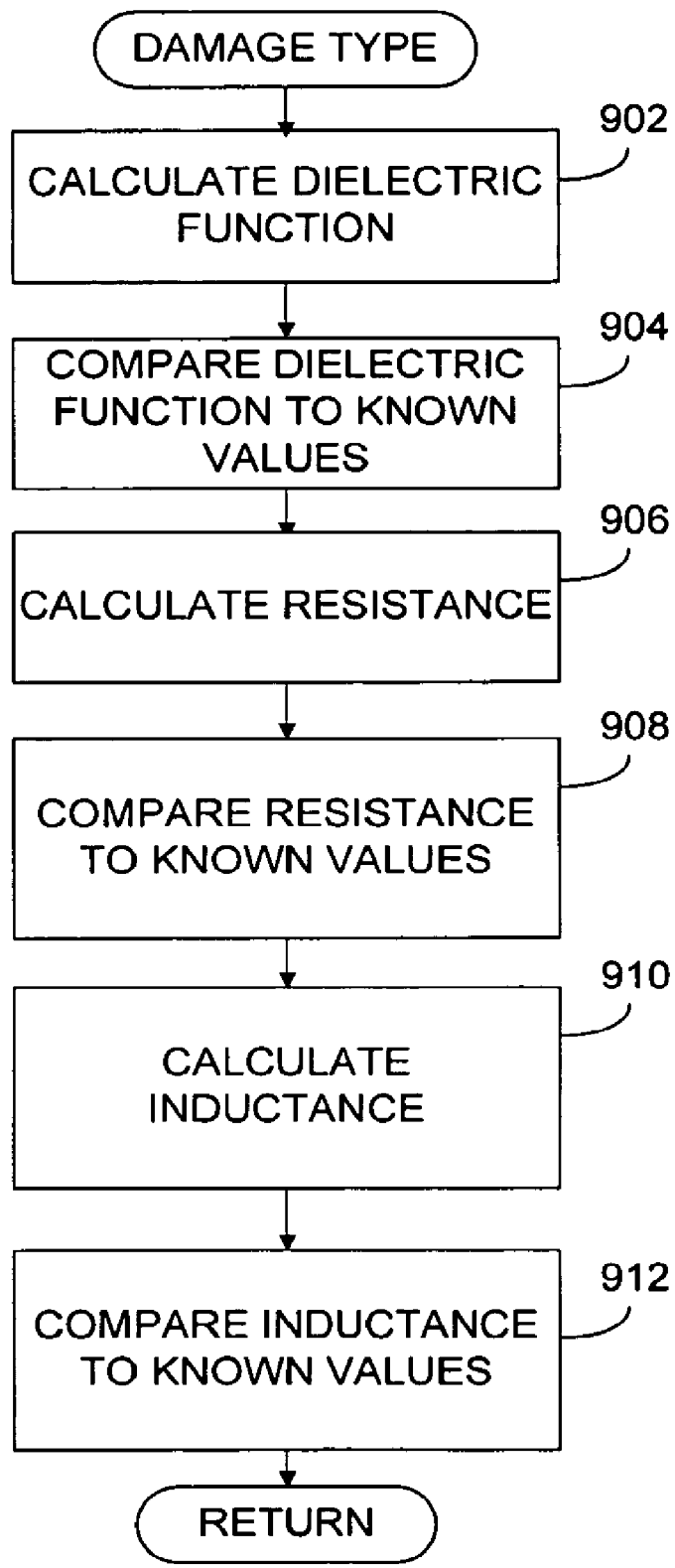
FIG. 9 is a flow diagram of the exemplary steps for determining the type of wire damage consistent with the present invention.

FIG. 9 depicts a flow diagram of the process performed in step 404 in more detail. As shown in FIG. 9, to determine the type of damage, the program extracts the real ($\in_1(\omega)$) and imaginary ($\in_2(\omega)$) components of the wire's dielectric function ($\in(\omega)$) from the measured impedance data (step 902). A cable, such as the insulated twisted-pair wire of the illustrative example, has a frequency-dependent resistance ($R(\omega)$) per meter, conductance ($C(\omega)$) per meter, inductance ($L(\omega)$) per meter, and conductance ($G(\omega)$) per meter. The capacitance and conductance are related to the dielectric function $\in(\omega)$ of the cable as shown below in Equation (1).

$$G(\omega)+i\omega C(\omega)=\Lambda\omega\in(\omega) \qquad \text{Equation (1)}$$

In Equation (1), "$\Lambda$" is a structure factor that depends on the configuration of the insulated wire (e.g., twisted pair) and is independent of frequency. For the insulated wire of the illustrative example, the structure factor $\Lambda$ can be computed as shown below in Equation (2).

$$\Lambda = \frac{\pi}{\cosh^{-1}\left(\frac{s}{d}\right)} \qquad \text{Equation (2)}$$

In Equation (2), "d" represents the diameter of each wire of the twisted pair of the insulated wire and "s" represents a center-to-center distance between the conductors of the wires of the insulated wire.

When the impedance measurement device affects a voltage between the wires of the twisted-pair insulated wire, the voltage and current can be computed by Equations (3) and (4).

$$\frac{\partial}{\partial x}V(x,t) = -I(x,t)R - \frac{\partial}{\partial t}LI(x,t) \qquad \text{Equation (3)}$$

$$\frac{\partial}{\partial x}I(x,t) = -GV(x,t) - \frac{\partial}{\partial t}CV(x,t) \qquad \text{Equation (4)}$$

The voltage of Equation (3) and the current of Equation (4) define a set of normal mode waves $A_\pm(x,t)$ propagating through the insulated wire. $A_\pm(x,t)$ is further shown below in Equation (5).

$$A_\pm(x,t)=\exp[\pm\gamma(\omega)x-i\omega t] \qquad \text{Equation (5)}$$

In Equation (5), "$\gamma$" is a propagation function, which can be defined by Equation (6).

$$\gamma(\omega)=\sqrt{(R(\omega)+i\omega L(\omega))(G(\omega)+i\omega C(\omega))}=(\alpha(\omega)+i\beta(\omega)) \qquad \text{Equation (6)}$$

In Equation (6), $\alpha(\omega)$ is the dissipation coefficient per meter of the insulated wire. $2\pi/\beta(\omega)$ represents the wavelength of the normal mode wave $A_\pm(x,t)$ propagating through the insulated wire. $v(\omega)=\omega/\beta(\omega)$ represents the speed ($v(\omega)$) at which the signals can propagate on the insulated wire. The propagation function can be rewritten as shown below in Equation (7).

$$\gamma(\omega)=\sqrt{(R(\omega)+i\omega L(\omega))i\Lambda\omega\in(\omega)} \qquad \text{Equation (7)}$$

Knowing the propagation function, the frequency-dependent open-circuit and short-circuit impedances are shown by Equations (8) and (9).

$$Z_{open}(\omega)=Z_0(\omega)\cot h[\gamma(\omega)) l] \qquad \text{Equation (8)}$$

$$Z_{short}(\omega)=Z_0(\omega)\tan h[\gamma(\omega) l] \qquad \text{Equation (9)}$$

In the illustrative example, the length "l" of the insulated wire (i.e., $L_T$) is 10 meters and yields the characteristic impedance $Z_0(\omega)$ shown below in Equation (10).

$$Z_0(\omega) = \sqrt{\frac{R(\omega)+i\omega L(\omega)}{G(\omega)+i\omega C(\omega)}} \qquad \text{Equation (10)}$$

The characteristic impedance can also be computed as the product of the measured open-circuit and short-circuit impedances as shown below in Equation (11).

$$Z_0^2=Z_{short}(\omega)Z_{open}(\omega) \qquad \text{Equation (11)}$$

Further, the propagation function can be found from the ratio of the measured open-circuit and short-circuit impedances as shown in Equation (12).

$$\gamma(\omega)l = \tanh^{-1}\sqrt{\frac{Z_{short}(\omega)}{Z_{open}(\omega)}} \qquad \text{Equation (12)}$$

Having obtained the characteristic impedance and the propagation function from the measured open-circuit and short-circuit impedance (i.e., using Equations (11) and (12)), the program can calculate the real and imaginary components of the dielectric function. Equations (7), (10), (11) and (12) yield the following relationships shown in Equations (13) and (14).

$$\gamma(\omega)Z_0(\omega) = R(\omega) + i\omega L(\omega) \qquad \text{Equation (13)}$$

$$\frac{\gamma(\omega)}{Z_0(\omega)} = i\Lambda\omega\varepsilon(\omega) \qquad \text{Equation (14)}$$

Accordingly, the frequency-dependent resistance ($R(\omega)$) per meter, inductance ($L(\omega)$) per meter, real component of the dielectric function ($\in(\omega)$), and imaginary component of the dielectric function ($\in(\omega)$)) can be calculated based on the characteristic impedance $Z_0(\omega)$ and propagation function $\gamma(\omega)$ as shown below in Equations (15), (16), (17) and (18).

$$R(\omega) = \text{Re}[\gamma(\omega)Z_0(\omega)] \qquad \text{Equation (15)}$$

$$L(\omega) = \text{Im}[\gamma(\omega)Z_0(\omega)/\omega] \qquad \text{Equation (16)}$$

$$\varepsilon_1(\omega) = -\text{Re}\left[\frac{\gamma(\omega)}{\omega\Lambda Z_0(\omega)}\right] \qquad \text{Equation (17)}$$

$$\varepsilon_2(\omega) = \text{Im}\left[\frac{\gamma(\omega)}{\omega\Lambda Z_0(\omega)}\right] \qquad \text{Equation (18)}$$

Therefore, having obtained the characteristic impedance and the propagation function from the measured open-circuit and short-circuit impedance (i.e., using Equations (11) and (12)), the program then uses Equations (17) and (18) to calculate the real ($\in_1(\omega)$) and imaginary ($\in_2(\omega)$) components of the dielectric function ($\in(\omega)$). In the illustrative example, the structure factor (A) of the insulated wire is calculated using the known illustrative diameter (d)=1 mm and known illustrative center-to-center distance (s)=2 mm.

Figure 10:
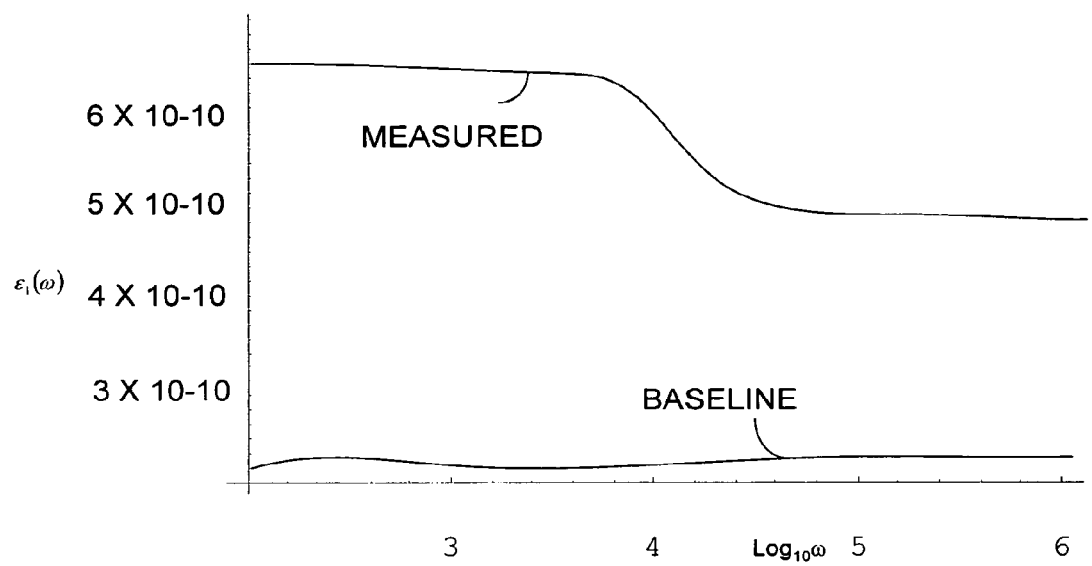
FIG. 10 is a calculated frequency-dependent real dielectric function spectrum.
Figure 11:
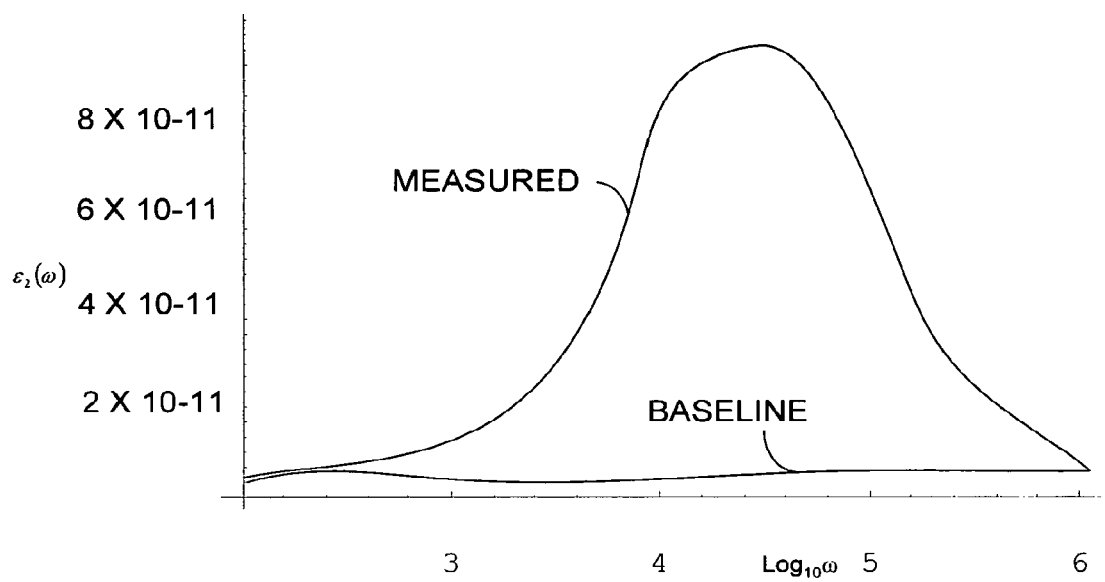
FIG. 11 is a calculated frequency-dependent imaginary dielectric function spectrum.

The real and imaginary components of the dielectric function for the impedance data, as calculated by the program, are shown in FIGS. 10 and 11, respectively.

Then, the program compares the calculated dielectric function to known dielectric function values exhibiting various types of damage in a wire (step 904). The dielectric function of the wire exhibits two microscopic processes: a relatively slow ionic process ($\in_{ionic}(\omega)$) that is on the order of tens of milliseconds or longer, and a relatively fast electronic process ($\in_e(\omega)$) that is on the order of nanoseconds and is nearly independent of frequency. The dielectric function ($\in(\omega)$) including its components is shown in Equation (19), and the components $\in_{ionic}(\omega)$ and $\in_e(\omega)$ are shown in Equations (20) and (21), respectively.

$$\varepsilon(\omega) = \varepsilon_{ionic}(\omega) + \varepsilon_e(\omega) \qquad \text{Equation (19)}$$

$$\varepsilon_{ionic}(\omega) = \frac{A_s\varepsilon_0}{1 + (i\omega\tau_{ionic})^{n_{ionic}}} \qquad \text{Equation (20)}$$

$$\varepsilon_e(\omega) = \frac{B_s\varepsilon_0}{1 + (i\omega\tau_e)^{n_e}} \qquad \text{Equation (21)}$$

In Equations (19) and (20), $\in_0$ is the dielectric constant of vacuum, $A_s$ is a geometric factor that is $\ll 1$, $B_s$ is a geometric factor that is =3-10, $n_{ionic} \approx 1$, $n_e \leq 1$, and $\tau$ is a time response. Thus, as the ionic process is a slower process, the ionic process influences the low frequency portion of the dielectric function's spectra, and the faster electronic process influences a wider range of frequencies in that it is larger than the ionic process.

A damage type database 228 contains frequency-dependent real and imaginary dielectric function data for combinations of known wire types, wire lengths, and damage types. The program compares the calculated frequency-dependant real and imaginary dielectric function values to the damage type database entries to determine whether the wire is damaged. For each wire type, the damage type database contains frequency-dependent real and imaginary dielectric function data for each wire length and each damage type. For example, the damage type database can include entries for the wire types twisted-pair, coaxial, and parallel-conductor wire. The wire types can further be designated by their conductor and insulation materials. The wire lengths can be delimited, for example, from 1 meter to 100 meters in 0.5 meter increments. The types of damage can include exposure to hydraulic fluid, humidity, and mechanical wear. One having skill in the art will appreciate that damage type database can include alternative or additional values. Further, the damage type database can be in a form other than a database, such as a multi-dimensional array.

A user of the data processing system can enter the wire type and wire length as values, which are received by the program, to narrow the database search to damage type database entries corresponding to the relevant wire type and wire length. If the calculated frequency-dependant real and imaginary dielectric function values correspond to the values of one or more of the relevant dielectric function data in the damage type database, then the program determines there is damage along the wire of the relevant damage type.

As shown in step 906, the program then calculates the frequency-dependent resistance of the wire. The frequency-dependent resistance of the wire can be affected by the skin effect, that is by an oxide layer or other type of layer contacting the conductor. In general, the resistance of the wire becomes frequency dependant when the skin depth in Equation (22) is satisfied.

$$\omega \geq \frac{2}{\sigma\mu r_0^2} \qquad \text{Equation (22)}$$

In Equation (22), $\omega$ represents the frequency, $\sigma$ represents conductivity of the conductor, $\mu$ is the magnetic permeability and is around $4\pi \times 10^{-7}$, and $r_0$ is the radius of the wire. Thus, the resistance increases with frequency as $\omega^{1/2}$.

Using Equation (15), the program calculates the frequency-dependent resistance for the wire and compares the calculated values to known values in the damage type database (step 908). Therefore, in addition to the entries described above for each wire type, the damage type database also contains frequency-dependent resistance values. The program compares the calculated frequency-dependent resistance to database entries for frequency-dependent resistance values corresponding to the same or similar wire type and wire length. If the program determines the values match or substantially match, then the program determines the wire has damage of the relevant damage type.

Then, the program calculates the frequency-dependent inductance of the wire (step 910). The frequency-dependent inductance of the wire can also be affected by the skin effect. For example, the low frequency inductance for a twisted pair wire is given by Equation (23).

$$L = \frac{\mu}{\pi} \text{Cosh}^{-1}\left[\frac{s}{d}\right] \quad \text{Equation (23)}$$

In Equation (23), the magnetic permeability ($\mu$) is about $4\pi \times 10^{-7}$. For the frequency range of around 100 kHz to around 1 MHz, the inductance decreases gradually. This behavior is due to the inductance depending on the magnetic field between the two conductors of the twisted-pair wire. When the skin effect is exhibited in one or both of the conductors of the twisted-pair wire, the inductance decreases more rapidly.

Using Equation (16), the program calculates the frequency-dependent inductance for the wire and compares the calculated values to known values in the damage type database (step 912). Therefore, in addition to the entries described above for each wire type, the damage type database also contains frequency-dependent inductance values. The program compares the calculated frequency-dependent inductance to database entries for frequency-dependent inductance values corresponding to the same or similar wire type and wire length. If the program determines the values match or substantially match, then the program determines the wire damage is of the relevant damage type.

Referring back to FIG. 4, if the program determines there is wire damage in step 406, then the program determines the amount of wire damage (step 408). Through extensive experimentation, the inventors have discovered that the low-frequency portion of the phase of the measured broadband impedance spectrum of the wire is sensitive to damage along the wire. If the wire is undamaged, the measured impedance phase spectrum is relatively flat at around −90° over a range of low frequencies, such as from about 100 Hz to about 1 MHz. However, if the wire is damaged, then the measured impedance phase deviates from −90° in the low-frequency range, such as from about 1 kHz to about 100 kHz. Further, the greater the amount of damage, the greater the impedance phase generally deviates from −90° to 0°.

Figure 12:
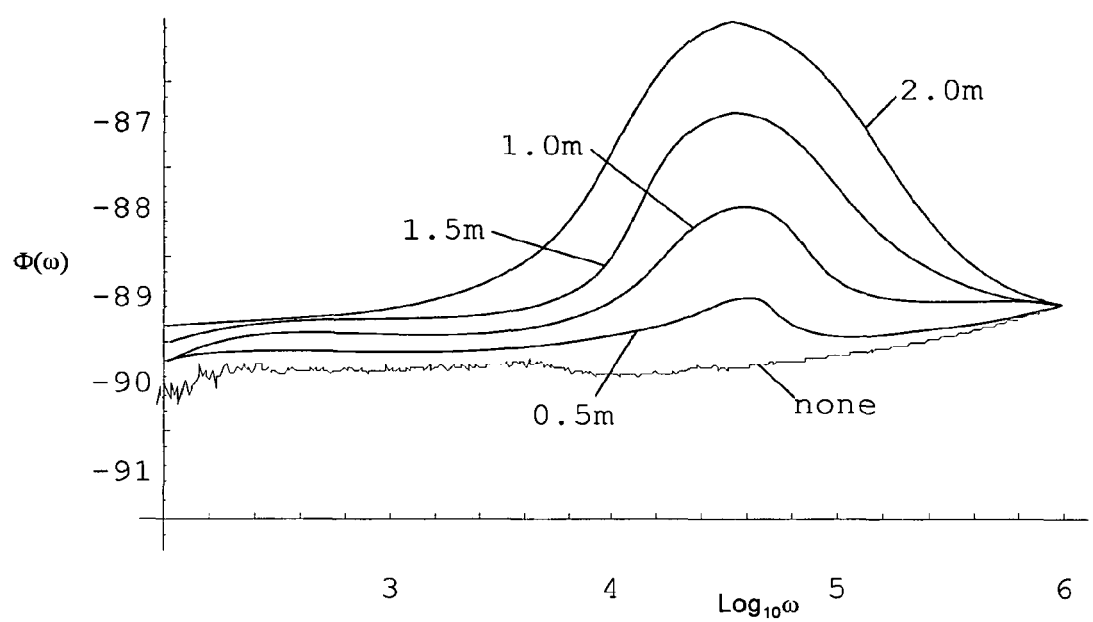
FIG. 12 is an illustration of amount of wire damage.

FIG. 12 depicts illustrative frequency-dependent impedance phase spectra for the wire for cases in which the wire has been damaged in various amounts by exposure to hydraulic fluid. As shown, the wire damage impresses its signature on the low-frequency portion (e.g., about 5 kHz to about 500 kHz) of the impedance phase spectrum. The greater the amount of damage, the greater the impedance phase generally deviates from −90° to 0° at around 50 kHz. As shown, at 50 kHz, when there is no damage (i.e., baseline) the impedance phase is around −90°, when there is 0.5 meter of damage the impedance phase is around −89°, when there is 1.0 meter of damage the impedance phase is around −88°, when there is 1.5 meters of damage the impedance phase is around −87°, and when there is 2.0 meters of damage the impedance phase is around −86°.

The frequency-dependent impedance phase spectrum for the wire in the illustrative example is thus depicted in FIG. 12 as the case in which there is 1.0 meter of wire damage. The program determines the amount of wire damage by calculating the average impedance phase of the wire over a range of frequencies (e.g., about 0 Hz to about 1 MHz or higher) and comparing the average impedance phase to values in a damage amount table 224. Damage amount table 224 includes amount of damage values for known wire types, wire lengths, types of damage, and average impedance phase values. As each of these variables impresses a signature on a wire, the amount of damage is determined by identifying a match corresponding to the measured wire. In the illustrative example, damage amount table 224 includes values for: wire types including twisted pair, coaxial, and parallel-conductor wires; wire lengths from 1 meter to 100 meters in 0.5 meter increments; amounts of damage from 0 meters to 100 meters (limited to the wire length) in 0.5 meter increments; and types of damage including exposure to hydraulic fluid, humidity, and mechanical wear. One having skill in the art will appreciate that damage amount table 224 can include alternative or additional values. Further, damage amount table 224 can be in the form of a data structure other than a table, such as a multi-dimensional array.

Knowing the wire type, the wire length and the type of damage, the program compares the calculated average impedance phase to the average impedance phase values of corresponding wire type, wire length, and damage type entries in damage amount table 224. In the illustrative is example, to determine the amount of damage, the program compares the calculated average impedance phase of the measured impedance to the known average impedance phase values for a 10 meter twisted-pair wire that has been exposed to hydraulic fluid. Based on the known average impedance phase values in the damage amount table, the program would determine that there is 1 meter of damage to the wire.

Alternatively, the program can analyze an impedance phase value other than the calculated average impedance phase value. For example, the program can analyze the measured impedance phase of the wire at a particular frequency, such as 10 kHz, or determine whether the measured impedance phase has a value within a predetermined range (e.g., less than −90°) at a predetermined frequency (e.g., 10 kHz).

After determining the amount of wire damage in step 408, the program then determines the location of the wire damage (step 410). Through extensive experimentation, the inventors have discovered that the high-frequency portion of the phase of the measured broadband impedance spectrum of the wire is sensitive to the distance from the measurement point to the location of the damage along the wire. As the distance from the measurement point to the location of the damage to the wire increases, the zero-crossing of the phase at high frequency shifts toward a lower frequency.

Consider an illustrative example of frequency-dependent impedance phase spectra for the wire for cases in which the wire has been damaged at various locations by exposure to hydraulic fluid. The wire damage impresses its signature on the high-frequency portion (e.g., about 5.7 MHz to about 6.45 MHz) of the impedance phase spectrum, with the phase spectrum for the case in which there is no damage (i.e., baseline) having a zero crossing at about 6.45 MHz). The greater the distance from the measurement point to the location of the damage, the more the zero-crossing of the phase spectrum deviates toward a lower frequency. The frequencies of the zero-crossings of the phase spectra of FIG. 13 are summarized below in Table 1.

TABLE 1

| Distance from measurement point to damage (m) | Frequency of zero-crossing (MHz) |
|---|---|
| No damage | ~6.45 |
| 0-1 | ~6.40 |
| 1-2 | ~6.35 |
| 2-3 | ~6.30 |
| 3-4 | ~6.20 |
| 4-5 | ~6.10 |
| 5-6 | ~5.93 |
| 6-7 | ~5.90 |
| 7-8 | ~5.80 |
| 8-9 | ~5.75 |
| 9-10 | ~5.70 |

Referring to the illustrative example, the wire damage is located 5-6 meters from the measurement point. The program determines the location of the wire damage by comparing the zero-crossing of the phase of the measured impedance to known zero-crossings of phases over a range of frequencies (e.g., about 1 MHz to about 100 MHz or higher) that are stored in a data structure, such as a zero-crossing table 226. Zero-crossing table 226 includes zero-crossing values for known wire types, wire lengths, types of damage, and distances from measurement points to damage locations. As each of these variables impresses a signature on a wire, the location of damage is determined by identifying a match corresponding to the measured wire. In the illustrative example, zero-crossing table 226 includes values for wire types including twisted pair, coaxial, and parallel-conductor wires; wire lengths from 1 meter to 100 meters in 0.5 meter increments; types of damage including exposure to hydraulic fluid, humidity, and mechanical wear; and distances from the measurement point to the damage from 0 meters to 100 meters (limited to the wire length) in 1.0 meter increments. One having skill in the art will appreciate that zero-crossing table 226 can include alternative or additional values. Further, zero-crossing table 226 can be in the form of a data structure other than a table, such as a multi-dimensional array.

Knowing the wire type, the wire length and the type of damage, the program compares the measured high-frequency impedance phase zero-crossing to the zero-crossing values corresponding to the same or similar wire type, wire length, and damage type entries in zero-crossing table 226. In the illustrative example, to determine the location of the damage, the program compares the measured impedance phase zero-crossing to the known zero-crossing values for a 10 meter twisted-pair wire that has been exposed to hydraulic fluid. Based on the known zero-crossing values in the zero-crossing table, the program would determine that the damage is located from 5-6 meters from the measurement point.

If the program determines in step 406 that there is no wire damage or after the program locates the wire damage in step 410, then the program displays the results of the analysis, for example, on the display device (step 412). The results include, for example, the type of damage, the amount of damage, and the location of the damage. In the illustrative example, the program displays that, at 5-6 meters from the measurement point, a 1 meter segment of the wire has been damaged by exposure to hydraulic fluid. Alternatively, the program can display additional or alternative results.

Therefore, methods, systems, and articles of manufacture consistent with the present invention determine the type of damage to a wire, the amount of damage, and/or the location of the damage from a single measurement point on the wire. Further, the methods, systems, and articles of manufacture consistent with the present invention provide beneficial improvements over conventional approaches, in that: wire prognosis can be performed; impedance is measured from a single measurement point; and/or as the impedance is measured from a single measurement point, there is a reduced risk of damaging the wire.

The foregoing description of an implementation of the invention has been presented for purposes of illustration and description. It is not exhaustive and does not limit the invention to the precise form disclosed. Modifications and variations are possible in light of the above teachings or may be acquired from practicing the invention. For example, the described implementation includes software but the present implementation may be implemented as a combination of hardware and software or hardware alone. Further, the illustrative processing steps performed by the program can be executed in an different order than described above, and additional processing steps can be incorporated. For example, the program can locate the wire damage prior to determining the amount of damage, and the program can calculate the inductance of the wire prior to calculating the wire's resistance. The invention may be implemented with both object-oriented and non-object-oriented programming systems. The scope of the invention is defined by the claims and their equivalents.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. A method comprising:
   using a computing machine to obtain information about a wire from broadband impedance measurements of a wire;
   determining a propagation function of normal mode waves propagating through an insulated wire, the propagation function from the broadband impedance measurements;
   determining at least one of frequency-dependent resistance, frequency-dependent inductance, and frequency-dependent dielectric function from the propagation function; and
   using at least one of frequency-dependent resistance, frequency-dependent inductance, and frequency-dependent dielectric function to obtain information about damage along the wire.

2. The method of claim 1, wherein determining the propagation function includes measuring open-circuit and short-circuit impedances.

3. The method of claim 2, wherein the propagation function is computed from a ratio of the open-circuit and short-circuit impedance measurements.

4. The method of claim 3, wherein real and imaginary components of the dielectric function are determined from the propagation function and from characteristic impedance.

5. The method of claim 4, wherein resistance and inductance are also determined from the propagation function and from the characteristic impedance.

6. The method of claim 1, wherein the dielectric function Is used to determine whether the wire is damaged.

7. The method of claim 1, further comprising using the frequency-dependent resistance to determine damage type.

8. The method of claim 1, further comprising using frequency-dependent inductance to determine damage type.

9. The method of claim 1, further comprising analyzing a high frequency phase portion of the measured broadband impedance to determine location of damage to the wire.

10. The method of claim 1 further comprising analyzing a low frequency phase portion of the measured broadband impedance to determine amount of damage to the wire.

11. The method of claim 10, wherein the low frequency portion is between about 100 Hz to about 1 MHz.

12. The method of claim 10, wherein the low frequency portion of the broadband impedance is computed by computing an average of impedance phase over a range of frequencies between about 0 Hz and 1 MHz.

13. Apparatus comprising:
   means for making measurements of broadband impedance of a wire;
   means for determining a propagation function of normal mode waves propagating through an insulated wire, the propagation function determined from the broadband impedance measurements;
   means for determining at least one of frequency-dependent resistance, frequency-dependent inductance, and frequency-dependent dielectric function from the propagation function; and
   means for using at least one of frequency-dependent resistance, frequency-dependent inductance, and frequency-dependent dielectric function to obtain information about damage along the wire.

14. An article comprising non-transitory computer-readable memory encoded with data for causing a computer to:
   determine a propagation function of normal mode waves propagating through an insulated wire, the propagation function determined from broadband impedance measurements of a wire;
   determine at least one of frequency-dependent resistance, frequency-dependent inductance, and frequency-dependent dielectric function from the propagation function; and
   use at least one of frequency-dependent resistance, frequency-dependent inductance, and frequency-dependent dielectric function to obtain information about wire damage.

* * * * *